(12) United States Patent
Nishimura et al.

(10) Patent No.: US 9,018,755 B2
(45) Date of Patent: Apr. 28, 2015

(54) JOINT STRUCTURE AND SEMICONDUCTOR DEVICE STORAGE PACKAGE

(71) Applicant: NGK Spark Plug Co., Ltd, Nagoya, Aichi (JP)

(72) Inventors: Sadahiro Nishimura, Ichinomiya (JP); Naoki Tsuda, Kasugai (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 0 days.

(21) Appl. No.: 14/248,017

(22) Filed: Apr. 8, 2014

(65) Prior Publication Data

US 2014/0299983 A1   Oct. 9, 2014

(30) Foreign Application Priority Data

Apr. 9, 2013 (JP) ................. 2013-081301

(51) Int. Cl.
| | | |
|---|---|---|
| H01L 23/10 | (2006.01) | |
| B23K 1/19 | (2006.01) | |
| B23K 1/00 | (2006.01) | |
| H01L 23/15 | (2006.01) | |

(52) U.S. Cl.
CPC ............... *B23K 1/19* (2013.01); *B23K 2201/40* (2013.01); *Y10T 403/479* (2015.01); *B23K 1/0016* (2013.01); *B23K 2203/18* (2013.01); *H01L 23/15* (2013.01); *H01L 23/10* (2013.01)

(58) Field of Classification Search
USPC .......... 257/700–705, 710, 730, 773, E23.127, 257/E23.193; 403/272
See application file for complete search history.

(56) References Cited

U.S. PATENT DOCUMENTS

| | | | | |
|---|---|---|---|---|
| 4,518,112 A | * | 5/1985 | Miller et al. ................ | 228/124.1 |
| 4,634,638 A | * | 1/1987 | Ainslie et al. ................ | 428/671 |
| 5,041,342 A | * | 8/1991 | Umeda et al. ................ | 428/632 |
| 6,617,514 B1 | * | 9/2003 | Ushikoshi et al. .......... | 174/84 R |

FOREIGN PATENT DOCUMENTS

| | | |
|---|---|---|
| JP | 2009-252858 A | 10/2009 |
| JP | 2010-067678 A | 3/2010 |
| JP | 2010-245141 A | 10/2010 |

* cited by examiner

*Primary Examiner* — Jasmine Clark

(74) *Attorney, Agent, or Firm* — Stites & Harbison PLLC; Jeffrey A. Haeberlin; James R. Hayne

(57) ABSTRACT

A joint structure includes: a ceramic member; a metallized layer formed on a surface of the ceramic member; and a metal member joined to the metallized layer via a brazing material. The metal member includes a base part erected on the metallized layer, and an extended part extended from the base part to define a predetermined gap with respect to the metallized layer. The base part includes an end joined to the metallized layer by a brazing material layer including the brazing material, and a side joined to the metallized layer around the base part by a fillet including the brazing material formed on the metallized layer around the base part. The extended part defines a recess at a position facing the metallized layer on which the fillet is formed.

5 Claims, 8 Drawing Sheets

US 9,018,755 B2

JOINT STRUCTURE AND SEMICONDUCTOR DEVICE STORAGE PACKAGE

CROSS-REFERENCE TO RELATED APPLICATION

This application claims priority from Japanese Patent Application No. 2013-081301 filed with the Japan Patent Office on Apr. 9, 2013, the entire content of which is hereby incorporated by reference.

BACKGROUND OF THE INVENTION

1. Field of the Invention

The present invention relates to a joint structure and a semiconductor device storage package that uses the joint structure.

2. Description of Related Art

Conventionally, the manufacturing of a semiconductor device storage package and the like has employed joining a ceramic member and a metal member by using a brazing material (for example, see JP-A-2009-252858, JP-A-2010-067678, and JP-A-2010-245141). As for this type of technique, the following semiconductor device storage package has been known, for example. In this semiconductor device storage package, a metal frame member (a metal shell) having a shape extending along the outer circumference of the ceramic substrate is joined to the surface of the ceramic substrate by using the brazing material.

In the above conventional art, as illustrated in FIG. 11A, a metallized layer P2 is formed on the surface of a ceramic substrate P1 (the surface on which a brazing is made). The brazing material is disposed between the metallized layer P2 and a metal shell P3. The metallized layer P2 and the metal shell P3 are then brazed. This brazing is made so that a brazing collection (a fillet) P4 having substantially a triangular cross section is formed.

BRIEF SUMMARY OF THE INVENTION

A joint structure includes: a ceramic member; a metallized layer formed on a surface of the ceramic member; and a metal member joined to the metallized layer via a brazing material. The metal member includes a base part erected on the metallized layer, and an extended part extended from the base part to define a predetermined gap with respect to the metallized layer. The base part includes an end joined to the metallized layer by a brazing material layer including the brazing material, and a side joined to the metallized layer around the base part by a fillet including the brazing material formed on the metallized layer around the base part. The extended part defines a recess at a position facing the metallized layer on which the fillet is formed.

DETAILED DESCRIPTION OF EXEMPLARY EMBODIMENTS OF THE INVENTION

Figure 1A:
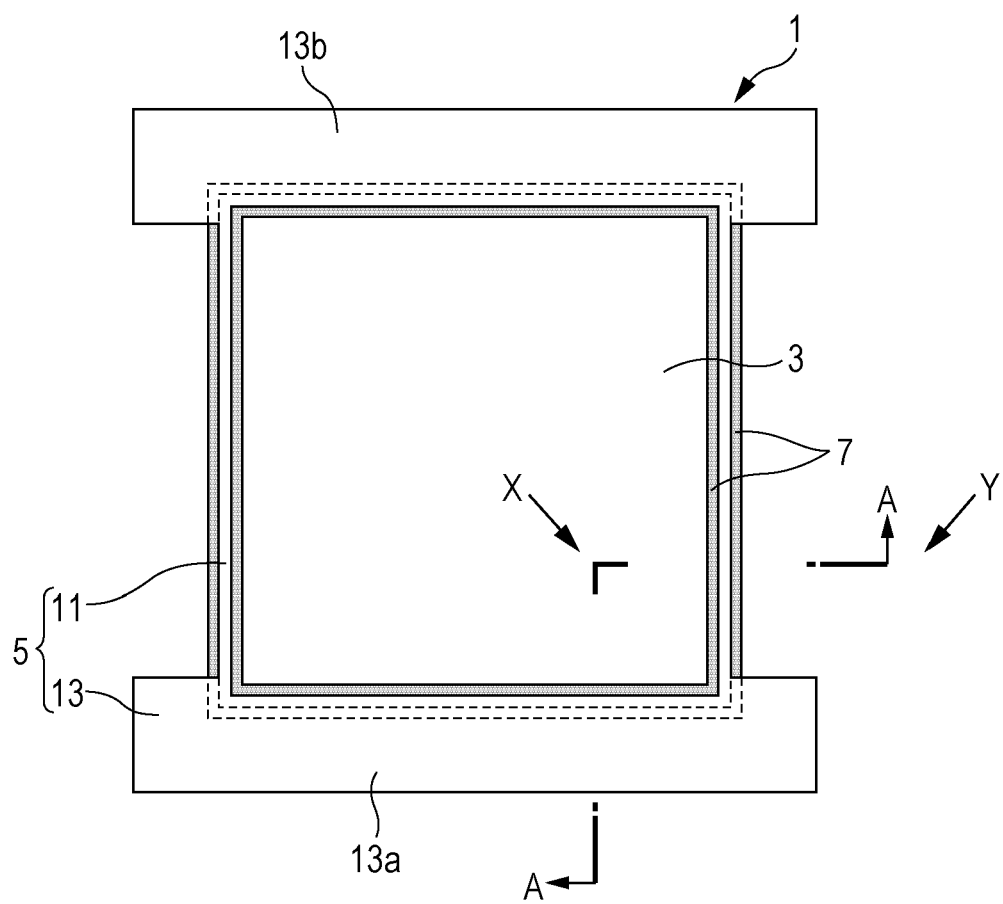
FIG. 1A is a plan view of a semiconductor device storage package of an embodiment 1 and FIG. 1B is a front view of the semiconductor device storage package.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 11A:
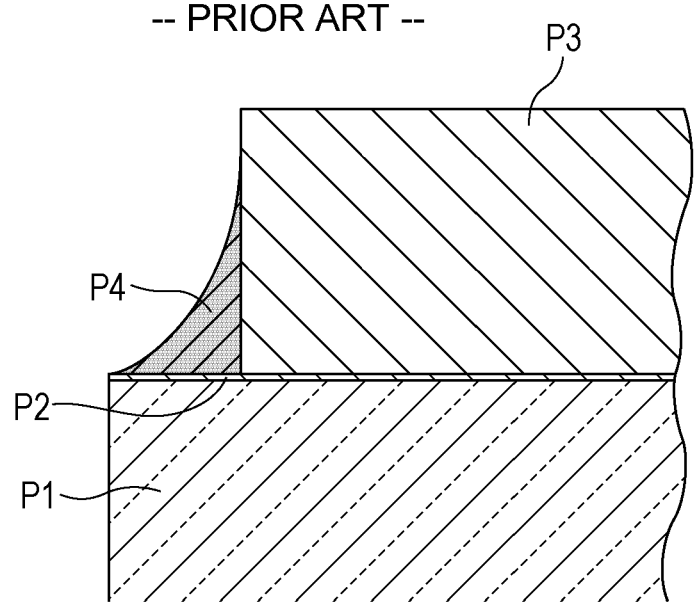
FIG. 11A and FIG. 11B are explanatory views of a conventional art.
Figure 11B:
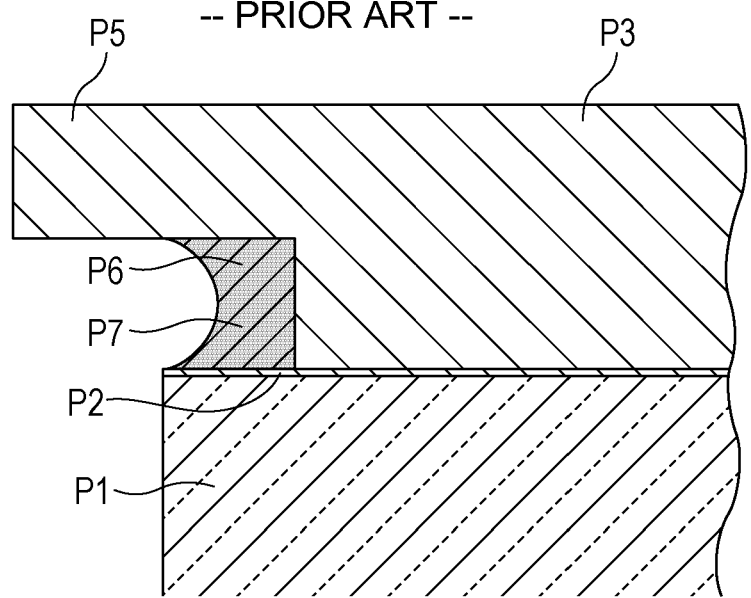

As illustrated in FIG. 11B, there is a case of the metal shell P3 protruding to the outer circumference side outward than the metallized layer P2. In this case, it may cause a state where a brazing material P7 is excessively collected in a U-shape part (a recess) P6 surrounded by a protruding part P5 of the metal shell P3 and the ceramic substrate P1, that is, "excessive brazing collection".

As such, the brazing member P7 excessively collected in the U-shape recess P6 can reach not only the side surface of the metal shell P3 but also the inner surface (the under surface in FIG. 11B) of the protruding part P5 of the metal shell P3.

In such the case, at a contraction (at a cooling) of the brazing member P7, a large force (caused by the self-contraction) directed to the center of the recess P6 is applied to the brazing member P7 itself. This has often caused the separation of the metallized layer P2 (the separation of metallized layer).

In order to address the above problem, it may be considered to reduce the volume (amount) of the brazing material P7. In the metal shell P3, however, there is a part having no protrusion. The reduced brazing member P7 at that part causes the fillet P4 to be smaller because of the shortage of the brazing member P7. This results in the reduction of strength of the brazing and the reduction of reliability of the brazing.

One of the purposes of the present disclosure is to provide a joint structure and a semiconductor device storage package that can reduce the occurrence of the separation of metallized layer without causing the reduction of the strength and the reliability of the brazing.

(1) A first form of the present disclosure (a joint structure) includes: a ceramic member; a metallized layer formed on a surface of the ceramic member; and a metal member joined to the metallized layer via a brazing material. The metal member includes a base part erected on the metallized layer, and an extended part extended from the base part to define a predetermined gap with respect to the metallized layer. The base part includes an end joined to the metallized layer by a brazing material layer including the brazing material, and a side joined to the metallized layer around the base part by a fillet including the brazing material formed on the metallized layer around the base part. The extended part defines a recess at a position facing the metallized layer on which the fillet is formed.

In the first form, the metal member has a base part erected on a metallized layer and an extended part that is extended from the base part (for example, parallel to the metallized layer) with a predetermined gap with respect to the metallized layer. Furthermore, the end of the base part is joined to the metallized layer by the brazing material layer. The side of the base part is joined to the metallized layer around the base part by the fillet formed on the metallized layer around the base part. Moreover, the extended part defines a recess at the position facing the metallized layer on which the fillet is formed.

Therefore, in joining the metal member to the ceramic member (specifically, the base part of the metal member to the metallized layer on the ceramic member) by the brazing material, even when a sufficient brazing material is arranged to the joint part for a better jointing, the fillet of a sufficient size having substantially a triangular cross section can be formed, by the brazing material, between the surface of the metallized layer and the side surface of the base part of the metal member. That is, the fillet has a sufficient size. Therefore, even when the end of the fillet extends to a large extent to the extended part side in joining the metallized layer to the base part of the metal member, the brazing material of the end side of the fillet is accommodated inside the recess. The brazing material in the end side of the fillet cannot be formed so as to bend in the U-shape as seen in the conventional art.

Thus, even when the force due to the self-contraction is applied to the brazing material at the contraction (at the cooling) of the brazing material, only a small force is applied in the direction along which the metallized layer would be separated, which can suppress the occurrence of the separation in the metallized layer (the separation of metallized layer).

Further, in the first form, as described above, only a small force is applied in the direction along which the metallized layer would be separated. It is thus not necessary to reduce the volume (amount) of the brazing material in order to prevent the separation of metallized layer. Therefore, the shortage of the brazing material can be suppressed, which allows for the prevention or suppression of the reduction in the strength of the brazing and the reduction in the reliability of the brazing.

(2) In a second form of the present disclosure, the base part has a first expanded recess that is recessed from the extended part side to the base part side and arranged in an integrated manner with the recess (i.e., the base part defines a first expanded recess that is adjacent to and integrated with the recess).

In the second form, the base part of the metal member defines a first expanded recess formed in an integrated manner with the recess. Therefore, even when a large fillet is formed by using a sufficient amount of the brazing material for the jointing, the end side of the fillet is accommodated in the first expanded recess. The end side of the fillet cannot extend and bend in the U-shape as seen in the conventional art.

Therefore, the second form of the present disclosure is able to implement a much larger fillet.

(3) In a third form of the present disclosure, the base part defines a second expanded recess that is recessed from the side of the base part adjacent to and integrated with the first expanded recess on a portion of the side of the base part where the extended part is not formed when viewed vertically.

The viscosity of the brazing material in the melting by heating is high. Therefore, the brazing material is more likely to be collected in a root part of the extended part (the root part protruding from the base part) than in the non-protruding part of the extended part. Thus, the brazing material is likely to be formed so as to rise in the peripheral of the root part of the extended part (for example, on the side surface of the base part). This can cause the brazing material to be excessively collected around the root part of the extended part.

In contrast, the third form has a second expanded recess formed in an integrated manner with the first expanded recess. That is, in the third form, there is a recess in the peripheral of the root of the extended part in which the brazing material is likely to be collected. This can suppress that the brazing material rises along the side surface of the base part, which can stably ensure the volume of the brazing material.

(4) In a fourth form of the present disclosure, the ceramic member is a plate-shaped ceramic substrate, and the metal member is a frame-shaped member disposed along an outer edge of the ceramic member.

The fourth form indicates an example of the shape and the arrangement of the ceramic member and the metal member. In the fourth form, a semiconductor device and the like can be accommodated on the surface of the ceramic member within a frame of the metal member.

(5) A fifth form (a semiconductor device storage package) of the present disclosure includes the joint structure of any one of the first form to the fourth form. The fifth form is an example of the semiconductor device storage package having the above-described joint structure.

In such semiconductor device storage package, the metal member and the ceramic member are firmly jointed. Therefore, this semiconductor device storage package has the advantage of high reliability and durability.

Described below will be a joint structure and a semiconductor device storage package related to the forms (embodiments) for implementing the present disclosure.

Figure 1B:
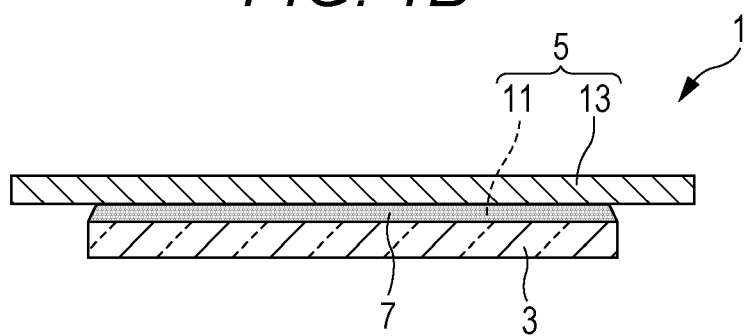

Embodiment 1 a) Firstly, a semiconductor device storage package having a joint structure of the present embodiment 1 will be described. As illustrated in FIG. 1A and FIG. 1B, the semiconductor device storage package 1 of the embodiment 1 includes a ceramic member (a ceramic substrate) 3 and a metal member 5 shaped in a square frame. The ceramic substrate 3 has substantially a square plate shape in a plan view. The metal member 5 is disposed along the outer edge of the ceramic substrate 3 on one of the surfaces of the ceramic substrate 3. The metal member 5 is joined by brazing material 7 (joined by brazing) to one of the surfaces of the ceramic substrate 3.

The semiconductor device (not shown) is stored on the ceramic substrate 3 in the space surrounded by the metal member 5. The ceramic substrate 3 has a plurality of ceramic layers containing alumina ($Al_2O_3$), for example. The ceramic substrate 3 is formed by laminating a plurality of ceramic green sheets and sintering them in an integrated manner, for example. The material of the ceramic substrate 3 may be mullite, aluminum nitride (AlN), silicon nitride ($Si_3N_4$), beryllia, and the like besides alumina.

Further, the material of the metal member 5 may be copper-molybdenum (CuMo) alloy that has a good thermal conductivity, for example. The material of the metal member 5 may be copper-tungsten (CuW) alloy, iron-nickel-cobalt (FeNiCo) alloy called Kovar, and other metal besides copper-molybdenum.

Furthermore, for the brazing material 7, various brazing materials including silver brazing such as silver-copper (Ag+Cu) may be used. Further, as illustrated in FIG. 1A and FIG. 1B, the metal member 5 includes a base part 11 and an extended part 13. The base part 11 has substantially a square frame shape in a plan view. The extended part 13 extends in the side direction from the upper part of the base part 11 (the upper part in FIG. 1B).

The extended part 13 is a plate-like portion. The extended part 13 protrudes in parallel to the surface of the ceramic substrate 3 (the lateral direction of FIG. 1B) away from the outer peripheral side of the base part 11. Specifically, the extended part 13 includes a first extended part 13a and a second extended part 13b. The first extended part 13a is formed at the position corresponding to the lower edge in FIG. 1A of the base part 11. The second extended part 13b is formed at the position corresponding to the upper edge in FIG. 1A of the base part 11.

Figure 2:
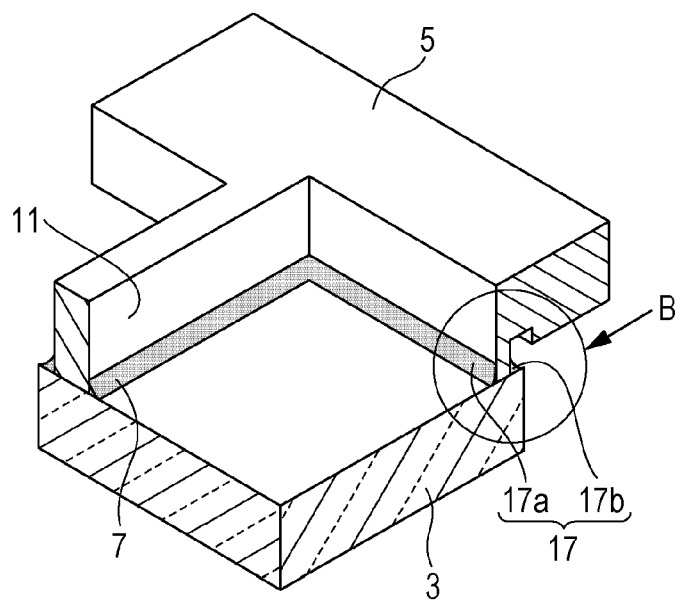
FIG. 2 is an enlarged perspective view of an A-A cross section of FIG. 1 when viewed from an X direction.

Further, FIG. 2 illustrates the root of the base part 11 of the metal member 5 in an enlarged view. As illustrated in FIG. 2, a fillet 17 (an inner fillet 17a and an outer fillet 17b) having substantially a triangular cross section is formed by the brazing material 7 in the inner peripheral side (the left side in FIG. 2) and the outer peripheral side (the right side in FIG. 2) of the root of the base part 11.

It is noted that a center brazing material layer 19 (see FIG. 3) is formed also between the base part 11 of the metal member 5 and the ceramic substrate 3 by the brazing material 7. The center brazing material layer 19 is connected to the inner fillet 17a and the outer fillet 17b in an integrated manner.

Figure 3:
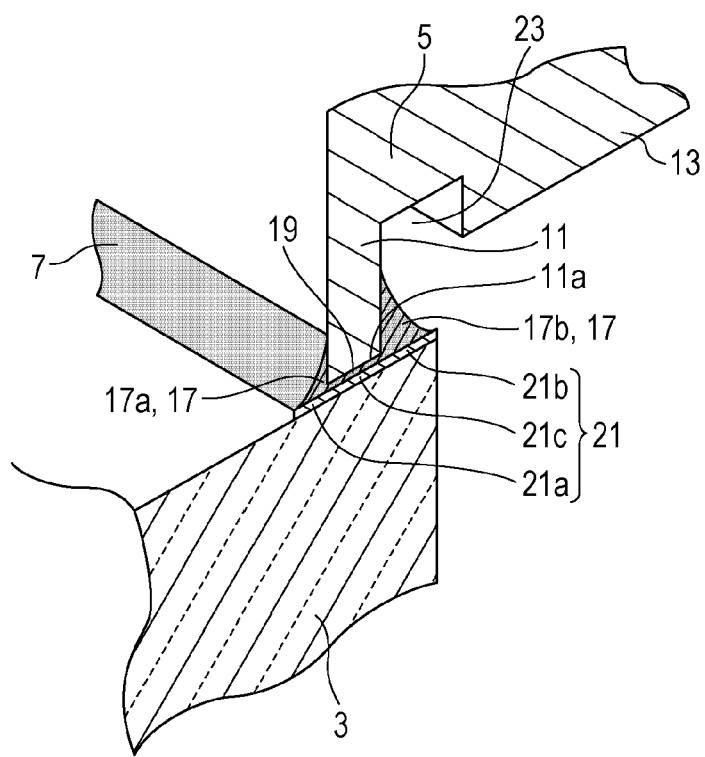
FIG. 3 is a perspective view in which a part B of FIG. 2 is further enlarged.
Figure 4:
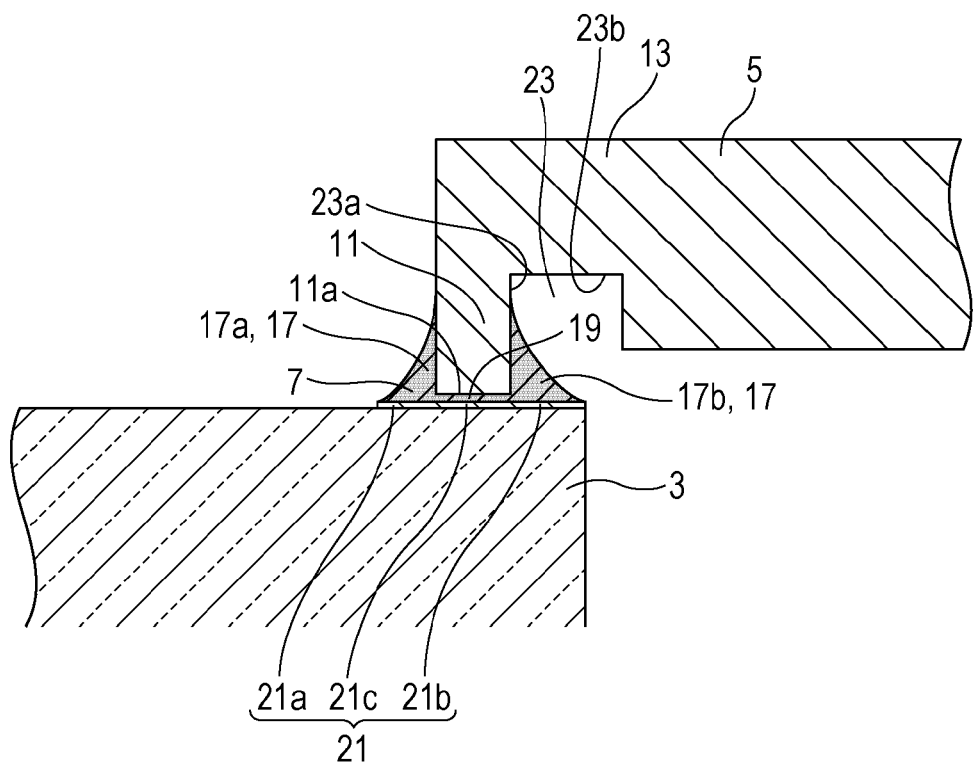
FIG. 4 is a sectional view of a cut plane vertical to a longitudinal direction of a base part in the semiconductor device storage package.

Furthermore, FIG. 3 and FIG. 4 illustrate the root of the base part 11 of the metal member 5 in a more enlarged view. As illustrated in these figures, a metallized layer 21 is formed on the surface of the ceramic substrate 3 to which the base part 11 of the metal member 5 is jointed. The lateral width (the lateral width in FIG. 4) of the metallized layer 21 is larger than that of a bottom surface 11a of the base part 11. The metallized layer 21 is made of tungsten (W), for example.

The metallized layer 21 includes an inner metallized layer 21a, a center metallized layer 21c, and an outer metallized layer 21b. The inner metallized layer 21a is a part of the metallized layer 21 to which the bottom surface of the inner fillet 17a contacts, and has a predetermined width (for example, 0.40 mm). The center metallized layer 21c is a part of the metallized layer 21 disposed between the base part 11 of the metal member 5 and the ceramic substrate 3, and has a predetermined width (for example, 0.60 mm). The outer metallized layer 21b is a part to which the bottom surface of the outer fillet 17b contacts, and has a predetermined width (for example, 0.60 mm).

The thickness of the metallized layer 21 is 30 μm, for example. The metallized layer 21 is disposed along the outer edge of the ceramic substrate 3 similarly to the base part 11 of the metal member 5. The metallized layer 21 has a square frame shape. As the material of the metallized layer 21, an admixture of tungsten and molybdenum and the like may be employed other than tungsten. Further, on the surface of the metallized layer 21, a metal layer that is superior in the wettability with the brazing material 7 such as a nickel (Ni) layer whose thickness is around 1.0 to 2.5 μm may be formed by a plating. On the nickel (Ni) layer, a gold (Au) layer whose thickness is approximately 2 to 3 μm may be formed by a plating.

That is, basically, the metal member 5 is joined to the ceramic substrate 3 by the inner fillet 17a, the outer fillet 17b, and the center brazing material layer 19 that are formed on the metallized layer 21, in the present embodiment.

b) Next, described will be the extended part 13 and its peripheral arrangement that are the essential part of the embodiment 1.

Arrangement of the Extended Part 13 at the Intermediate Position in the Direction Along the Frame of the Base Part 11

In the present embodiment, the metal member 5 has the base part 11 and the extended part 13, as illustrated in FIG. 4. The base part 11 is erected on the metallized layer 21. The extended part 13 is extended from the base part 11 so as to be parallel to the metallized layer 21 with a predetermined gap with respect to the metallized layer 21 (specifically, the outer metallized layer 21b). Furthermore, a recess 23 is formed at the position (the upper part in FIG. 4) facing the outer metallized layer 21b in the extended part 13 (i.e., the extended part 13 defines a recess 23 at position facing the metallized layer 21 on which the fillet is formed). Here, the part of the extended part 13 located further from the base part 11 than the recess 23 is formed with a gap of 0.50 mm with respect to the plane formed along the surface of the metallized layer 21.

The recess 23 is formed so as to have a rectangular cross section (that is, the cross section vertical to the longitudinal direction of the base part 11). This cross section is a cross section vertical to the direction (hereafter, referred to as "longitudinal direction") in which the base part 11 that is the frame-shaped member extends along the outer edge of the ceramic substrate 3.

That is, the recess 23 is formed by that the outer metallized layer 21b side (the under surface side in FIG. 4) of the extended part 13 is cut off along the side surface of the outer circumference side (the right side in FIG. 4) of the base part 11 for a predetermined width (for example, 1.00 mm) and a predetermined depth (for example, 1.00 mm). The recess 23 is formed over the entire extended part 13 along the longitudinal direction of the base part 11.

Therefore, the outer fillet 17b is formed on the outer metallized layer 21b and extends upward in FIG. 4 along the side surface of the outer circumference side (the right side in FIG. 4) of the base part 11. The end of the outer fillet 17b reaches the inside of the recess 23. In detail, while the outer fillet 17b reaches an inner side surface 23a of the recess 23, it does not reach an inner upper surface 23b.

Figure 5:
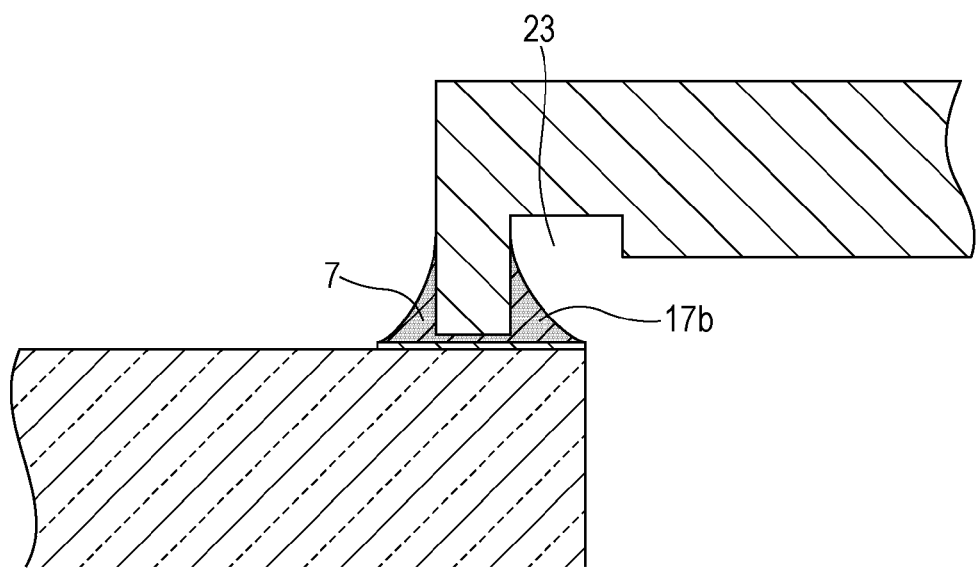
FIG. 5 is a sectional view of a cut plane of FIG. 4 when a usage of a brazing material is reduced.

On the other hand, the inner fillet 17a is formed on the inner metallized layer 21a, and extends upward in FIG. 4 along the side surface of the inner circumference side (the left side in FIG. 4) of the base part 11. It is noted that, as illustrated in FIG. 5, the end of the outer fillet 17b may not reach the recess 23 when a small amount of the brazing material 7 is used.

Arrangement of the Extended Part 13 Around the End in the Direction Along the Frame of the Base Part 11

Figure 6:
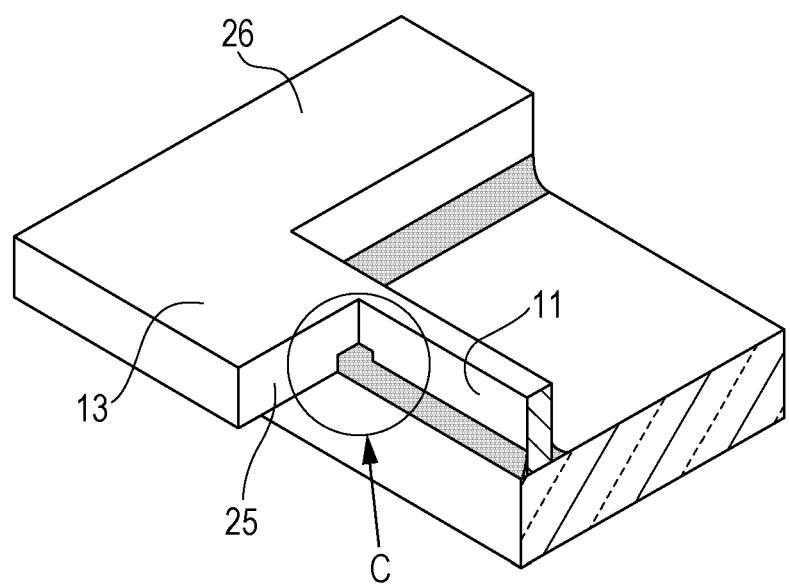
FIG. 6 is an enlarged perspective view of the A-A cross section of FIG. 1 when viewed from a Y direction.
Figure 7:
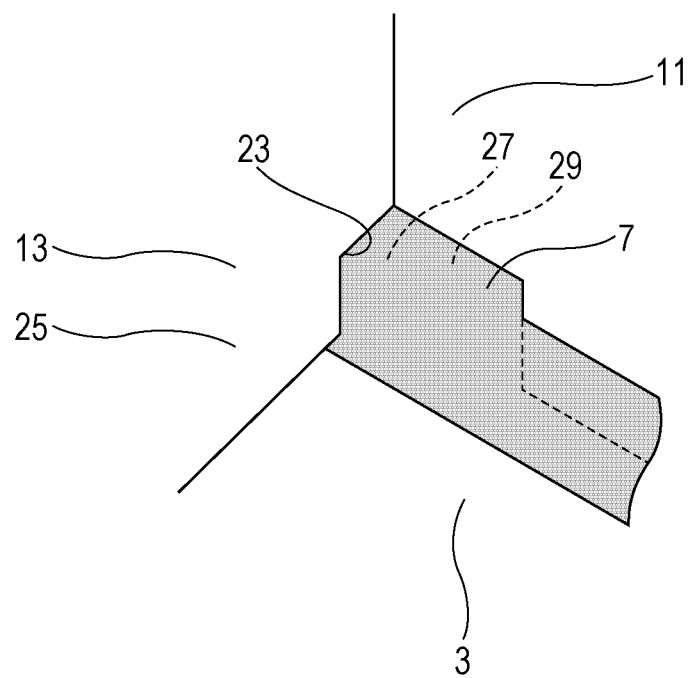
FIG. 7 is a perspective view in which a part C of FIG. 6 is further enlarged.

Further, as illustrated in FIG. 6, the arrangement of the root part of the extended part 13 close to the base part 11, in particular, the arrangement of the root part and its peripheral of an end 25 (in the longitudinal direction of the base part 11) of the extended part 13 is different from the part depicted in FIG. 2. That is, the arrangement of the root part and its peripheral of the end 25 of the extended part 13 is different from the arrangement of the root part of a center part 26 (the different part from the end 25) of the extended part 13 extending along the longitudinal direction of the base part 11.

Specifically, as illustrated in enlarged views of FIG. 7 and FIG. 8A to FIG. 8C, the above-described recess 23 is formed at the root part of the end 25 of the extended part 13 along the longitudinal direction (the lateral direction in FIG. 8A) of the base part 11. Furthermore, a first expanded recess 27 is formed in the base part 11 (i.e., the base part 11 defines a first expanded recess 27). The first expanded recess 27 recesses from the extended part 13 side to the base part 11 side and is integrated with the recess 23 (i.e., the first expanded recess 27 is adjacent to and integrated with the recess 23).

Figure 8A:
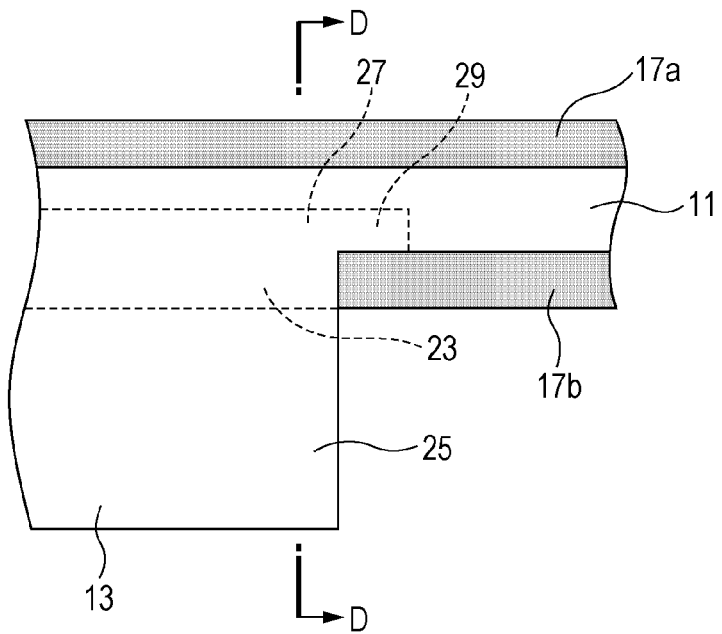
FIG. 8A is a plan view in which the part C of FIG. 6 is enlarged and FIG. 8B is a front view in which the part C of FIG. 6 is enlarged.

The first expanded recess 27 is formed by that the recess 23 is cut out so as to have a predetermined width (the width in the lateral direction in FIG. 8A), a predetermined depth to the base part 11 side (the depth (recess) in the vertical direction in FIG. 8A), and a predetermined height (the height in the vertical direction in FIG. 8B) and reaches the bottom surface 11a of the base part 11. Specifically, the first expanded recess 27 has a size of the height of 1.00 mm by the depth of 1.00 mm, for example.

Furthermore, a second expanded recess 29 is formed in the base part 11 (i.e., the base part 11 also defines a second expanded recess 29). The second expanded recess 29 recesses from the first expanded recess 27 toward the side of the base part 11 where the extended part 13 is not formed (the right side in FIG. 8A) (i.e., the second expanded recess 29 extends along the base part 11 beyond the extended part 13). Furthermore, the second expanded recess 29 is formed in an integrated manner with the first expanded recess 27.

Figure 8B:
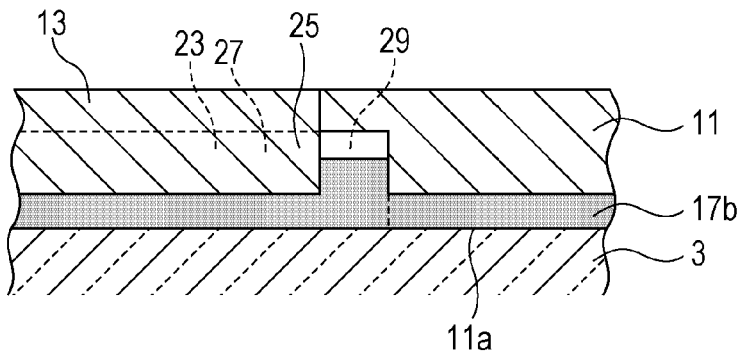
Figure 8C:
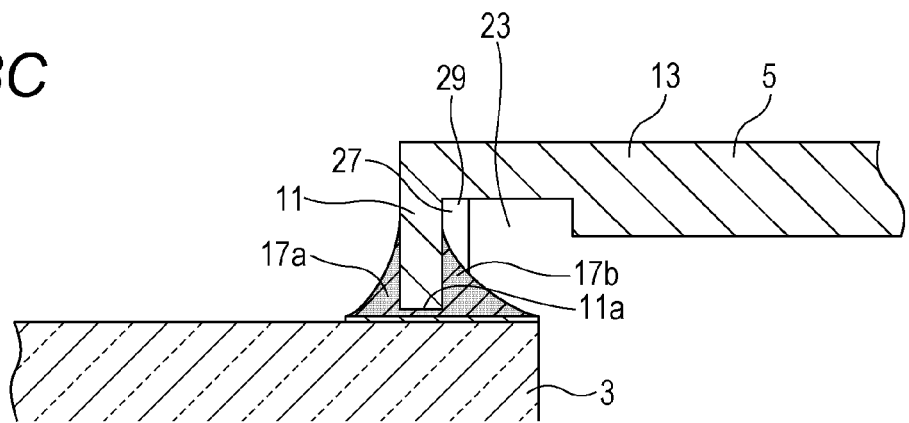
FIG. 8C is a sectional view of the D-D cross section of FIG. 8A.

The second expanded recess 29 is formed by that the base part 11 is cut off in the right direction in FIG. 8A so as to have the same depth as the first expanded recess 27 (the depth in the vertical direction in FIG. 8A), the same height as the first expanded recess 27 (the height in the vertical direction in FIG. 8B), and a predetermined width (the width in the lateral direction in FIG. 8A). Specifically, the second expanded recess 29 has a rectangular parallelopiped shape with a depth of 1.00 mm (the depth (recess) in the vertical direction in FIG. 8A) by 0.50 mm in width (the width in the lateral direction in FIG. 8A) by 1.00 mm in height (the height in the vertical direction in FIG. 8B). The relative dimensions shown in FIG. 8A, FIG. 8B, and FIG. 8C are not necessarily shown to scale.

Therefore, the recess 23, the first expanded recess 27, and the second expanded recess 29 form an integrated concave structure.

c) Next, a manufacturing process of the semiconductor device storage package of the embodiment 1 will be briefly explained.

An alumina ceramic substrate 3 is fabricated by a known process, though not shown. Further, a copper-molybdenum metal member 5 is fabricated by a known process. For example, the ceramic substrate 3 can be fabricated by laminating ceramic green sheets whose material is alumina and sintering them for integration. At this time, the metallized layer 21 can be formed by printing tungsten paste on a predetermined position and sintering it with the ceramic green sheets at the same time.

Further, in the fabrication of the metal member 5, the copper-molybdenum metal board is stamped out in the frame shape. Alternatively, the metal board may be fabricated by a casting. Then, a cutting work and a drilling work are applied to a predetermined part on the metal board (for example, the part where the recess 23, the first expanded recess 27, and the second expanded recess 29 are to be formed). Thereby, the metal member 5 can be fabricated.

Then, the metal member 5 is placed on the ceramic substrate 3 on which the metallized layer 21 has been formed. Furthermore, the brazing material 7 including the thin plate-shaped silver brazing with a predetermined width is disposed between the ceramic substrate 3 and the metal member 5.

Then, the above members are heated at a predetermined brazing temperature (for example, 800 degrees centigrade). This heating causes the brazing material 7 to be melted into the shape of the inner fillet 17a or the outer fillet 17b. They are solidified by a cooling with their shapes kept.

It is noted that, when the brazing material 7 is melted, the outer fillet 17b rises along the side surface of the outer circumference side of the base part 11. The amount of the brazing material used for the brazing is set to such degree that the end of the outer fillet 17b reaches the inside of the recess 23 (in detail, such degree that it reaches on the way of the inner side surface 23a). Thus, the brazing material does not reach the inner upper surface 23b of the recess 23.

As set forth, the semiconductor device storage package 1 of the embodiment 1 is obtained.

Next, the advantage of the embodiment 1 will be described. The metal member 5 of the embodiment 1 is arranged so that the extended part 13 extends from the base part 11. The recess 23 having the rectangular cross section is provided to the under surface (in detail, the part facing the outer metallized layer 21b) of the extended part 13 of the metal member 5.

Therefore, in joining the metal member 5 to the ceramic substrate 3 by the brazing material 7, even when the sufficient amount of the brazing material 7 for the joining is disposed to the joint part, the sufficient size of the outer fillet 17b having substantially the triangular cross section can be formed by the brazing material 7 between the surface of the outer metallized layer 21b and the side surface of the outer circumference side of the base part 11 of the metal member 5. Further, the sufficient size of the inner fillet 17a having substantially the similar, triangular cross section can be formed between the surface of the inner metallized layer 21a and the side surface of the inner circumference side of the base part 11 of the metal member 5.

That is, the sufficient size of the outer fillet 17b is provided in the embodiment 1. In joining the metallized layer 21 to the base part 11 of the metal member 5, even when the outer fillet 17b is formed so that its end largely extends to the extended part 13 side, the brazing material 7 in the end side of the outer fillet 17b is accommodated inside the recess 23. The brazing material 7 in the end side of the outer fillet 17b cannot extend bending in a U-shape as seen in the conventional art.

Therefore, even if the force due to the self-contraction is applied to the brazing material 7 when the brazing material 7 is contracted (at the cooling), only a small force is applied in the direction along which the metallized layer 21b would be separated. This can suppress the occurrence of the separation (the separation of metallized layer) in the outer metallized layer 21b.

Further, in the embodiment 1, as described above, only a small force is applied in the direction along which the metallized layer 21b would be separated. It is thus unnecessary to reduce the volume (amount) of the brazing material 7 for preventing the separation of metallized layer. Therefore, the shortage of the brazing material 7 can be suppressed, which allows for the prevention or suppression of the reduction in the strength of the brazing and the reduction in the reliability of the brazing.

Furthermore, in the embodiment 1, the base part 11 has the first expanded recess 27 arranged in an integrated manner with the recess 23 in the root side of the end 25 of the extended part 13. Furthermore, the base part 11 has the second expanded recess 29 formed in an integrated manner with the first expanded recess 27.

Therefore, even when the large outer fillet 17b is formed using a sufficient amount of the brazing material 7 for the jointing, the end of the outer fillet 17b is accommodated in the first expanded recess 27. Therefore, the embodiment 1 is able to implement a much larger outer fillet 17b.

The brazing material 7 is likely to be collected around the root of the end 25 of the extended part 13. In this regard, the first expanded recess 27 and the second expanded recess 29 are provided, so that the brazing material 7 is unlikely to be collected. This makes it difficult for the brazing material 7 to rise, which allows the proper fillet 17 to be formed.

Therefore, in the semiconductor device storage package 1 of the embodiment 1, the metal member 5 and the ceramic substrate 3 are firmly joined. The semiconductor device storage package 1 thus has the distinct advantage of the high reliability and durability.

Embodiment 2

Figure 9A:
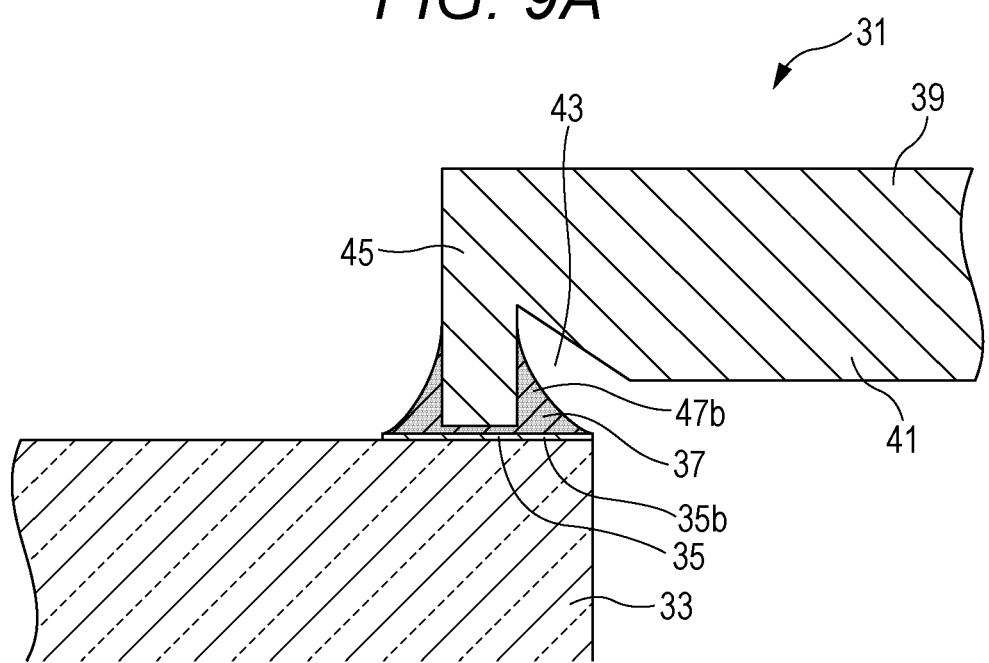
FIG. 9A is a sectional view of a cut plane vertical to a longitudinal direction of a base part in a semiconductor device storage package of an embodiment 2 and FIG. 9B a sectional view of a cut plane vertical to a longitudinal direction of a base part in a semiconductor device storage package of an embodiment 3.

Next, an embodiment 2 will be described. In the description of the embodiment 2, the same description as provided in the above-described embodiment 1 will be omitted. As illustrated in FIG. 9A, the semiconductor device storage package 31 of the embodiment 2 includes a ceramic substrate 33 and a metallized layer 35 formed thereon similarly to the above-described embodiment 1. Furthermore, a metal member 39 is joined on the metallized layer 35 by a brazing material 37.

In particular, in the embodiment 2, a recess 43 is formed in an extended part 41 of the metal member 39 similarly to the above-described embodiment 1. However, the shape of the recess 43 is different from that in the embodiment 1. Specifically, in the embodiment 2, the shape of the cross section (the cross section vertical to the longitudinal direction of a base part 45) of the recess 43 is a triangle. In detail, the under surface side (in FIG. 9A) of the extended part 41 is cut off upward (in FIG. 9A) along the side surface of the outer circumference side of the base part 45. The triangular cross section is arranged so that the cut-off part of the side surface forms an edge.

The embodiment 2 has the same advantage as the above-described embodiment 1. The shape of the cross section of the recess 43 is not limited in particular as long as the end of the outer fillet 47b is arranged so as not to reach the position corresponding to the upper part of an outer metallized layer 35b.

Embodiment 3

Figure 9B:
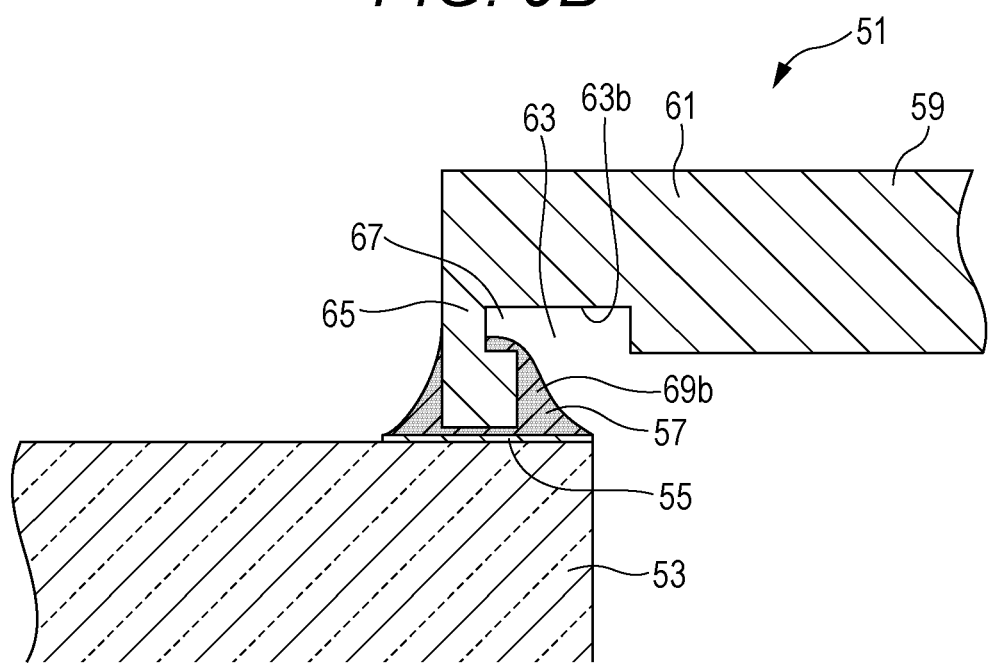

Next, an embodiment 3 will be described. In the description of the embodiment 3, the same description as provided in the above-described embodiment 1 will be omitted. As illustrated in FIG. 9B, the semiconductor device storage package 51 of the embodiment 3 includes a ceramic substrate 53 and a metallized layer 55 formed thereon similarly to the above-described embodiment 1. Furthermore, a metal member 59 is joined on the metallized layer 55 by a brazing material 57.

In particular, in the embodiment 3, a recess 63 is formed in an extended part 61 of the metal member 59 similarly to the above-described embodiment 1. Then, a first expanded recess 67 is formed so as to be connected to the recess 63. The first expanded recess 67 is formed by that a part of a base part 65 is cut off (toward the left side in FIG. 9B).

The embodiment 3 has the same advantage as the above-described embodiment 1. Furthermore, in the embodiment 3, the first expanded recess 67 is formed in an integrated manner with the recess 63. Therefore, even when the use of a large amount of the brazing material 57 results in a larger outer fillet 69b, the end of the outer fillet 69b is unlikely to reach an inner upper surface 63b of the recess 63.

Embodiment 4

Figure 10:
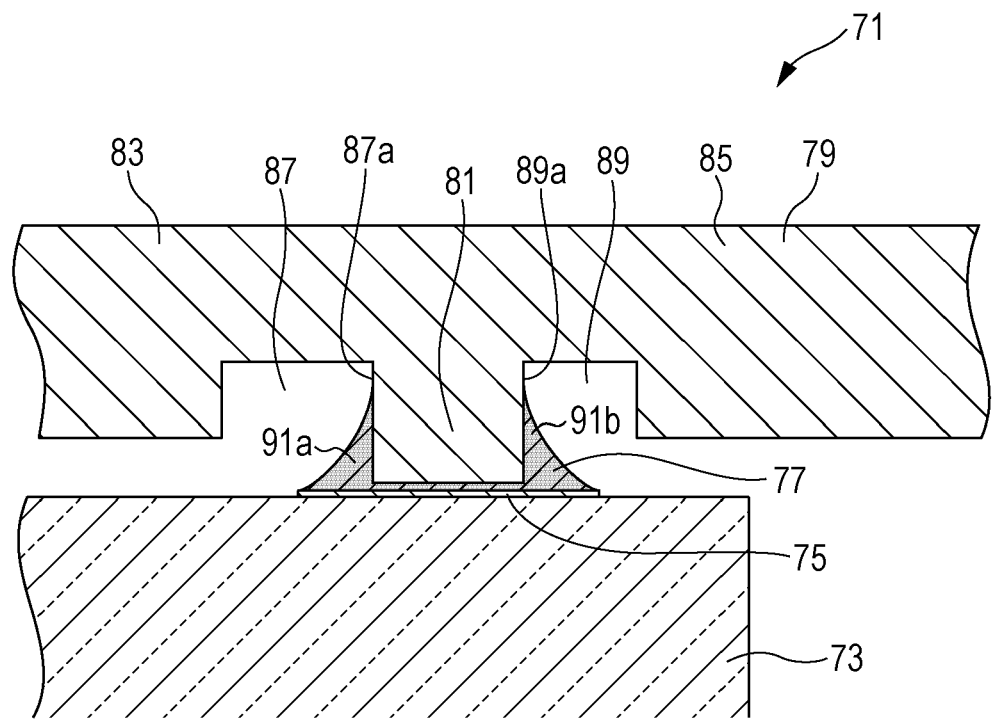
FIG. 10 is a sectional view of a cut plane vertical to a longitudinal direction of a base part in a semiconductor device storage package of an embodiment 4.

Next, an embodiment 4 will be described. In the description of the embodiment 4, the same description as provided in the above-described embodiment 1 will be omitted. As illustrated in FIG. 10, the semiconductor device storage package 71 of the embodiment 4 includes a ceramic substrate 73 and a metallized layer 75 formed thereon similarly to the above-described embodiment 1. Furthermore, a metal member 79 is joined on the metallized layer 75 by a brazing material 77.

In particular, the metallized layer 75 is formed more towards the inner side (the left side in FIG. 10) than the outer edge of the ceramic substrate 73 in the embodiment 4 as compared to embodiment 1. A base part 81 of the metal member 79 is joined to the metallized layer 75.

Further, in the embodiment 4, extended parts 83 and 85 are provided to both sides (the left and the right in FIG. 10) of the base part 81. There are recesses 87 and 89 similar to the above-described embodiment 1 formed in the extended parts 83 and 85, respectively.

Therefore, the end (the upper end) of an inner fillet 91a enters the inside recess 87 and reaches on the way of an inner side surface 87a. Further, the end of an outer fillet 91b enters the outside recess 89 and reaches on the way of an outer side surface 89a.

The embodiment 4 also has the same advantage as the above-described embodiment 1.

It is noted that the present disclosure is not limited in any way to the above-described embodiments and modifications. The present disclosure can of course be implemented in various forms without departing from its spirit.

For example, each arrangement of the embodiments 1 to 4 may be properly combined.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A joint structure comprising:
   a ceramic member;
   a metallized layer formed on a surface of the ceramic member; and
   a metal member joined to the metallized layer via a brazing material,
   wherein the metal member includes a base part erected on the metallized layer, and an extended part extended from the base part to define a predetermined gap with respect to the metallized layer,
   wherein the base part includes an end joined to the metallized layer by a brazing material layer including the brazing material, and a side joined to the metallized layer around the base part by a fillet including the brazing material formed on the metallized layer around the base part, and
   wherein the extended part defines a recess at a position facing the metallized layer on which the fillet is formed.

2. The joint structure according to claim 1, wherein the base part defines a first expanded recess that is adjacent to and integrated with the recess.

3. The joint structure according to claim 2,
   wherein the base part extends beyond the extended part, and wherein the base part defines a second expanded recess that is integrated with the first expanded recess and extends along the base part beyond the extended part.

4. The joint structure according to claim 1, wherein the ceramic member is a plate-shaped ceramic substrate, and the metal member is a frame-shaped member disposed along an outer edge of the ceramic member.

5. A semiconductor device storage package comprising the joint structure according to claim 1.

* * * * *